(12) United States Patent
Yu

(10) Patent No.: US 6,211,565 B1
(45) Date of Patent: Apr. 3, 2001

(54) APPARATUS FOR PREVENTING ELECTROSTATIC DISCHARGE IN AN INTEGRATED CIRCUIT

(75) Inventor: Ta-Lee Yu, Taichung (TW)

(73) Assignee: Winbond Electronics Corporation, Hsinchu (TW)

( * ) Notice: Subject to any disclaimer, the term of this patent is extended or adjusted under 35 U.S.C. 154(b) by 0 days.

(21) Appl. No.: 09/301,325

(22) Filed: Apr. 29, 1999

(51) Int. Cl.[7] .......................... H01L 23/48; H01L 29/44; H01L 23/495; H01L 23/62
(52) U.S. Cl. .......................... 257/691; 257/666; 257/696; 257/698; 257/692; 257/728; 257/724; 257/725; 257/784; 257/669; 257/355; 257/43; 361/126; 361/56; 361/91
(58) Field of Search .......................... 257/666, 676, 257/669–674, 690, 691, 696, 698, 728, 725, 724, 784, 355, 43; 321/126, 56, 91

(56) References Cited

U.S. PATENT DOCUMENTS

| | | | |
|---|---|---|---|
| 4,934,820 | * | 6/1990 | Takahashi et al. .......... 257/676 |
| 5,334,803 | * | 8/1994 | Yamamura et al. .......... 257/676 |
| 5,394,008 | * | 2/1995 | Ito et al. .......... 257/666 |
| 5,486,720 | * | 1/1996 | Kierse .......... 257/706 |
| 5,608,260 | * | 3/1997 | Carper et al. .......... 257/666 |
| 5,644,167 | * | 7/1997 | Weiler et al. .......... 257/672 |
| 5,712,753 | | 1/1998 | Yeh et al. . |
| 5,715,127 | * | 2/1998 | Yu .......... 361/56 |
| 5,753,977 | * | 5/1998 | Kusaka et al. .......... 257/787 |
| 5,786,626 | * | 7/1998 | Brady et al. .......... 257/673 |
| 5,796,570 | * | 8/1998 | Mekdhanasarn et al. .......... 361/126 |
| 5,821,609 | * | 10/1998 | DiStefano et al. .......... 257/619 |
| 5,825,081 | * | 10/1998 | Hosomi et al. .......... 257/668 |
| 5,889,308 | * | 3/1999 | Hong et al. .......... 257/666 |
| 5,970,321 | * | 10/1999 | Hively .......... 438/123 |
| 6,008,532 | * | 12/1999 | Carichner .......... 257/691 |

OTHER PUBLICATIONS

M. Matsumoto et al., "New Failure Mechanism due to Non–Wired Pin ESD Stressing," pp. 2.5.1–2.5.5.

* cited by examiner

Primary Examiner—Alexander O. Williams
(74) Attorney, Agent, or Firm—Finnegan, Henderson, Farabow, Garrett & Dunner, L.L.P.

(57) ABSTRACT

An integrated circuit package includes a semiconductor chip, a plurality of wired pins, and at least one non-wired pin. The size of the non-wired pin is minimized, or the non-wired pin is eliminated, in order to increase the lead pin spacing. The increase in lead pin spacing prevents electrostatic discharge failure in an integrated circuit package due to electrostatic stressing of the non-wired pin.

7 Claims, 6 Drawing Sheets

APPARATUS FOR PREVENTING ELECTROSTATIC DISCHARGE IN AN INTEGRATED CIRCUIT

BACKGROUND OF THE INVENTION

1. Field of Invention

The present invention relates to an integrated circuit and, more particularly, to a method for preventing electrostatic discharge failure in an integrated circuit package.

2. Description of the Related Art

Very Large-Scale Integration (VLSI) allows manufacturers to produce integrated circuits (IC) with smaller dimensions, higher density and increased power and performance. With the increased power and performance these circuit packages are able to handle an increasing number of input/output signals that result from the increased integration of circuit functions. To support these increased functions and signals, additional terminals are provided for the IC. These additional signals are electrically connected to the IC through connector pins connected to the terminals.

IC packages are an interconnected array of active and passive components, which are capable of performing a complete circuit function, fabricated on a single crystal of semiconductor material (usually silicon). IC packages are constructed in a variety of package types which contain the circuit. During the packaging process, a lead frame provides the pins for making connections to an external circuit.

As the functions and number of pins on IC packages has increased with a decrease in the size of the IC package, the pin pitch on the IC package has rapidly decreased. Pin pitch is a recognized term of art which is defined as the distance of pins of an IC center-to-center. This decreased pin pitch increases the possibility of circuit failure due to electrostatic discharge (ESD) between pins.

ESD is considered a major reliability threat of integrated circuit technologies. The possibility of ESD failure involving non-wired pins has been considered. Matsumoto et al., discloses in the reference, *New Failure Mechanism due to Non-Wired Pin ESD Stressing*, that ESD failure can occur due to discharge through the resin of an IC package from non-wired pins to wired pins. Narrow pin or lead pitches may increase the electric field during non-wired pin ESD stressing so as to degrade ESD immunity of the non-wired pins. The breakdown of resin or other materials, which allows ESD current discharge from a non-wired pin to an adjacent wired pin, is determined by the strength of the electric field between the pins. Matsumoto et al. concludes that even when ESD stressing is low, discharge can occur when ESD stress is repeatedly applied to the non-wired pin. As a result, increased discharge current flows into the adjacent wired pin and destroys the adjacent wired pin.

U.S. Pat. No. 5,712,753 to Yeh et al. discloses a method to prevent electrostatic discharge failure in an integrated circuit package by means of electrically connecting a non-wired pin to a wired pin on the integrated circuit package. The wired pin is in turn connected to an electrostatic discharge protection circuit. Thus, the integrated circuit package prevents electrostatic discharge stressing of the non-wired pin.

U.S. Pat. No. 5,715,127 to Yu also discloses a method to prevent electrostatic discharge failure in an integrated circuit package. Yu discloses electrically connecting the non-wired pins to a metal lead frame of the package. The metal lead frame is connected to a bonding pad which in turn is connected to an electrostatic discharge protection circuit. This construction is intended to prevent ESD failure due to non-wired pin stressing.

One disadvantage of both prior art preventive methods is that it is necessary to provide additional ESD protection circuitry in the integrated circuit design. As minimization of circuit size and complexity is a goal of circuit design, it would be desirable to provide a means to prevent the problem of ESD failure without the need of additional circuitry.

SUMMARY OF THE INVENTION

Accordingly, the present invention is directed to a lead frame or chip carrier and methods for preventing ESD failure that substantially obviate one or more of the problems due to limitations and disadvantages of the related art. Additional features and advantages of the invention will be set forth in part in the description which follows, and in part will be apparent from the description, or may be learned by practice of the invention. The objectives and other advantages of the invention will be realized and attained by means of the elements and combinations particularly pointed out in the appended claims.

To achieve these and other advantages and in accordance with the purpose of the invention, as embodied and broadly described herein, the invention comprises a method for preventing electrostatic discharge failure in an integrated circuit which includes a semiconductor chip, a plurality of wired pins, and at least one non-wired pin, the electrostatic discharge failure being due to electrostatic discharge stressing of the non-wired pin, the method comprising: minimizing the at least one non-wired pin in a lead frame in order to increase pin spacing locally among wired pins adjacent the non-wired pin.

Also, in accordance with the present invention, there is provided a lead frame or chip carrier for preventing electrostatic discharge failure in an integrated circuit which includes a semiconductor chip, a plurality of wired pins, and at least one non-wired pin, the electrostatic discharge failure being due to electrostatic discharge stressing of the non-wired pin, the lead frame comprising: a lead frame, wherein the at least one non-wired pin is formed such that only a tip at an outermost portion remains.

It is to be understood that both the foregoing general description and the following detailed description are exemplary and explanatory only and are not restrictive of the invention, as claimed.

BRIEF DESCRIPTION OF THE DRAWINGS

Other features and advantages of the present invention will become apparent in the following detailed description of the preferred embodiment, with reference to the accompanying drawing, of which.

DETAILED DESCRIPTION OF THE PREFERRED EMBODIMENTS

According to the present invention, a method and device structure are provided to prevent ESD failure in an integrated circuit package that do not require additional ESD protection circuitry. Current IC packages are designed with specific pin configurations. Typically, lead frames are produced separately from the IC. Conventional lead frames may be produced for a fixed number of IC pin counts. For example, conventional lead frames are produced for 4, 8, 16, and 32 pin ICs. Alternatively, specific lead frames may be produced for specific IC packages. While designing the lead frame, wired and non-wired pins for specific IC packages are known. In accordance with the present invention, specific lead frames are designed to not only provide I/O connection of signals to the IC package but also to prevent ESD discharge failure without additional circuitry.

An embodiment consistent with the present invention provides an integrated circuit which shrinks the non-wired pins of a lead frame in order to increase pin pitch locally and local pin spacing of adjacent wired pins and thereby prevent ESD discharge failure. Another embodiment consistent with the present invention eliminates non-wired pins in a lead frame altogether in order to prevent ESD failure. Yet another embodiment consistent with the present invention is to form a conventional lead frame and clip one or more non-wired pins from the frame. Still another embodiment consistent with the present invention is to pattern a chip carrier such that no wiring traces are formed in the position that would otherwise be occupied by non-wired traces. These embodiments overcome the disadvantages associated with prior art devices.

Figure 1:
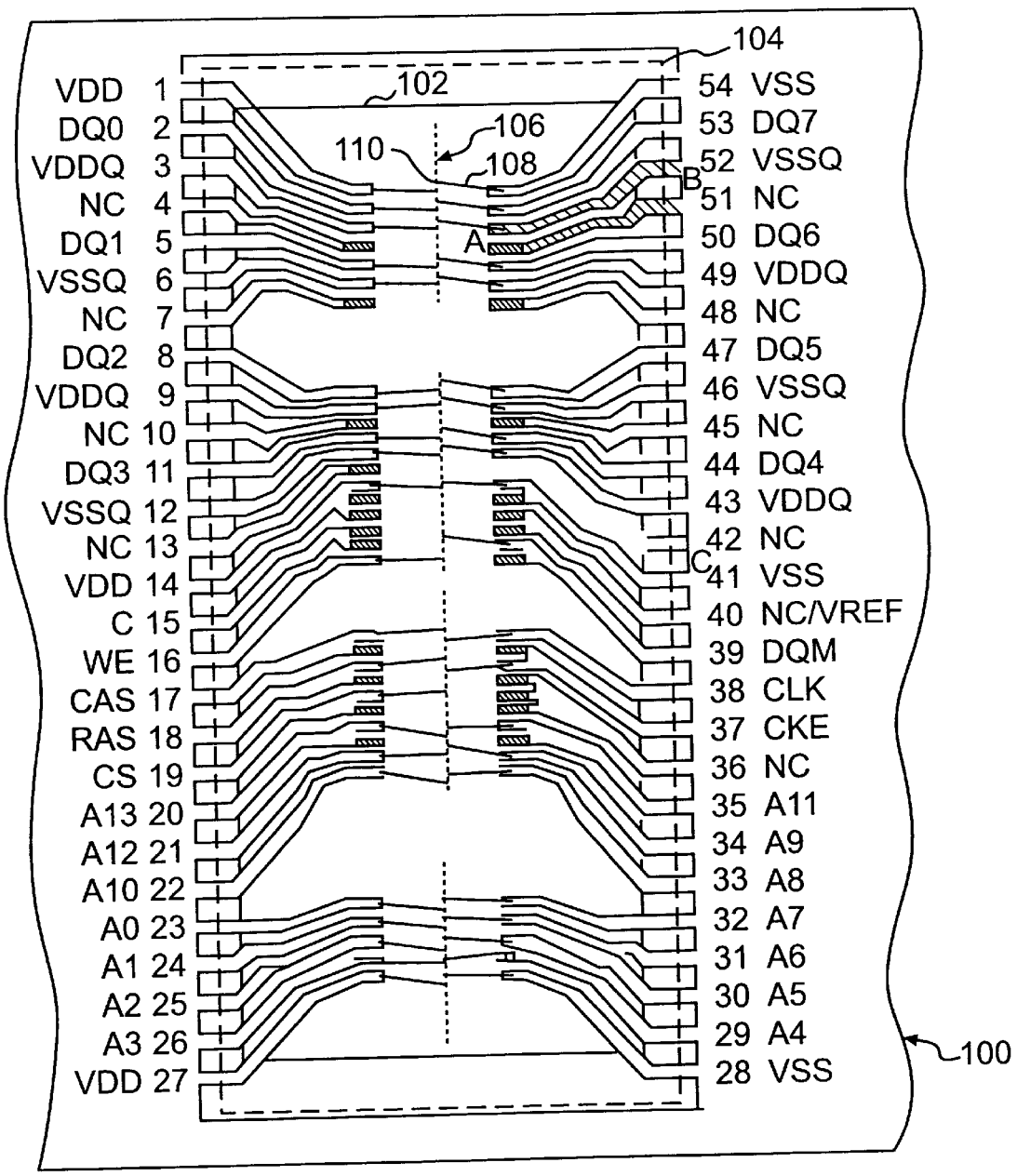
FIG. 1 depicts the pin lead layout of an IC package lead frame.
Figure 2:
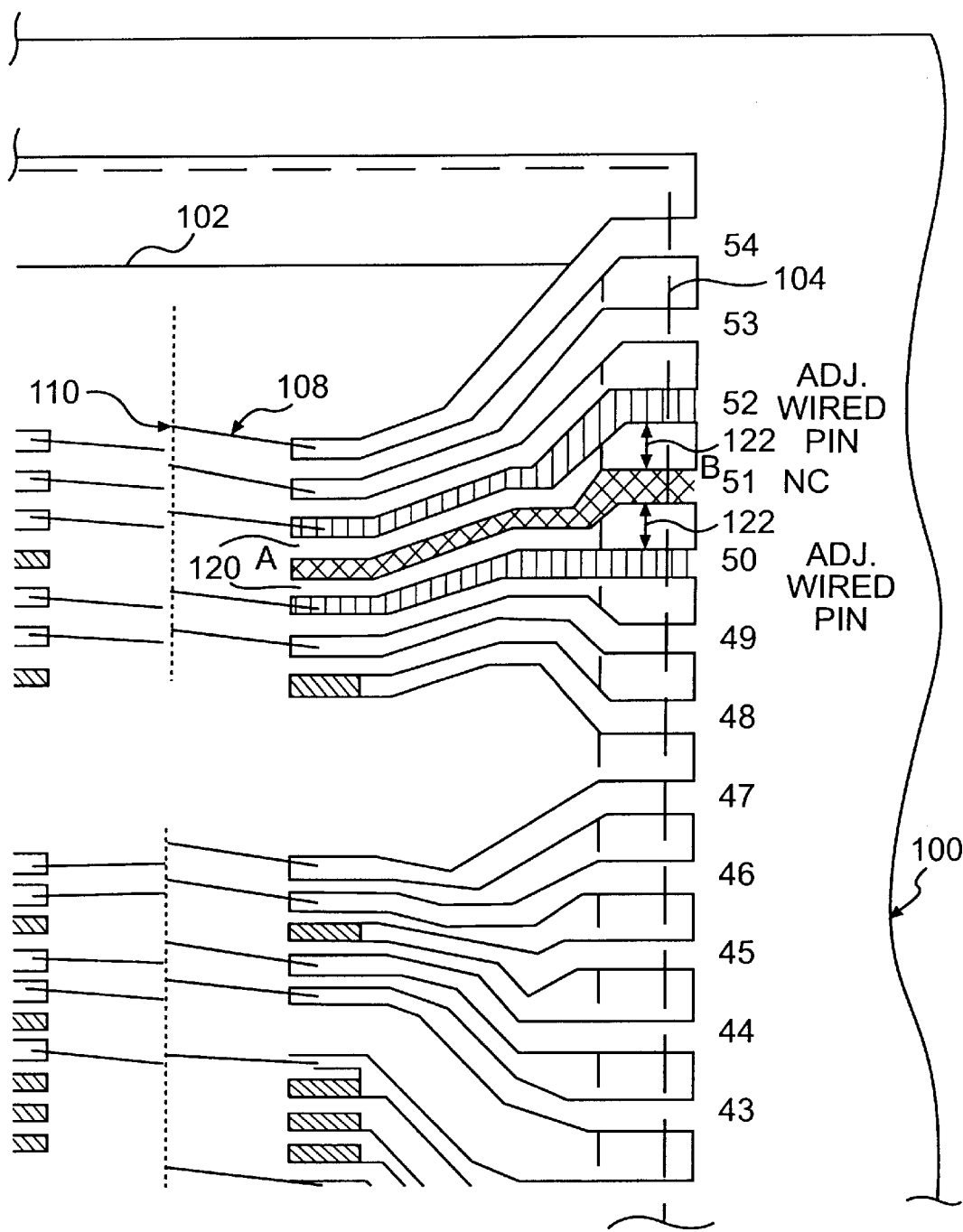
FIG. 2 depicts an enlarged view of a pin lead layout of an IC package lead frame.
Figure 3:
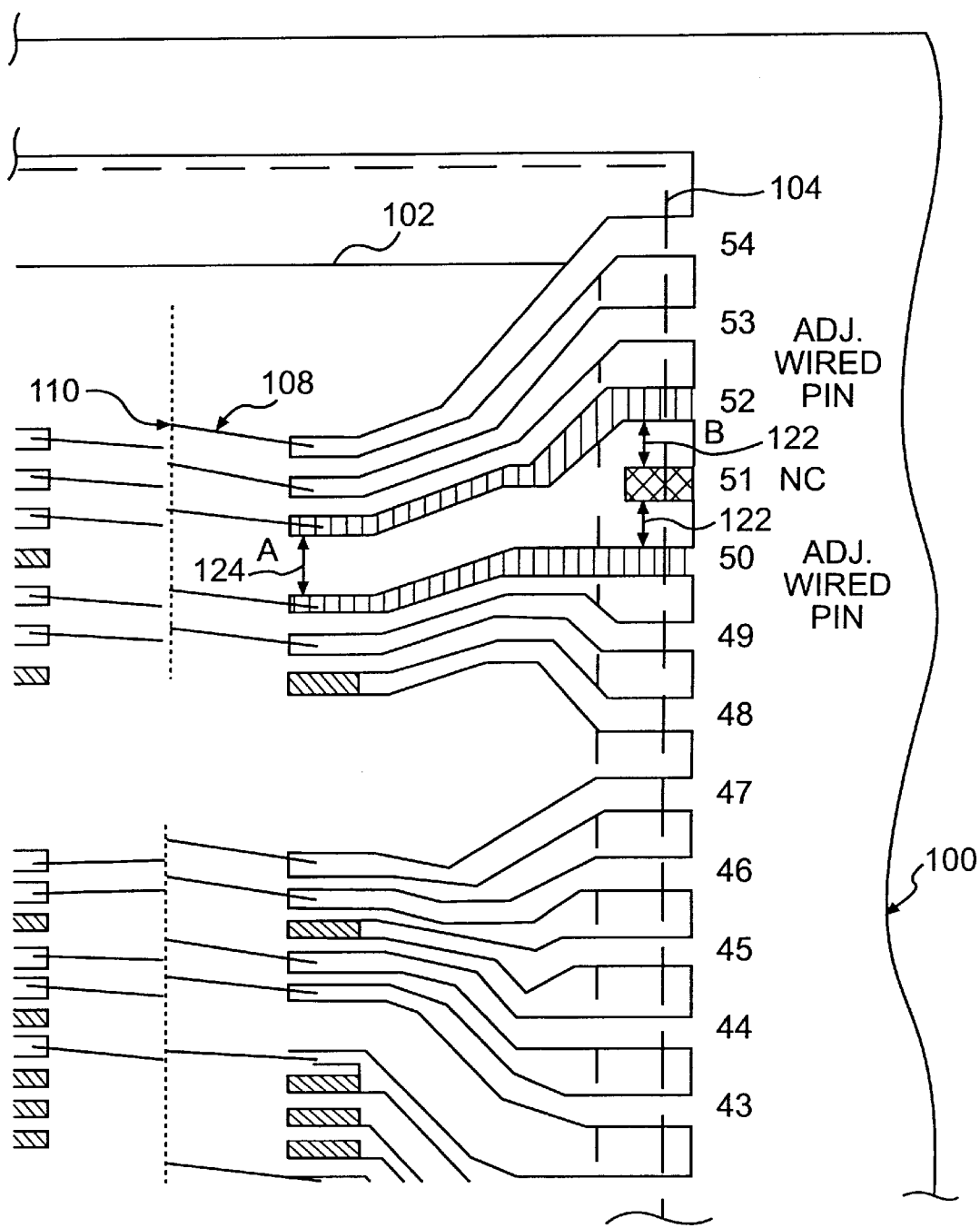
FIG. 3 depicts an enlarged view of a pin lead layout of an IC package lead frame with the non-wired pin lead shrunk.

A detailed description of a preferred embodiment of the present invention is provided with reference to FIGS. 1–3. FIG. 1 illustrates an example of an IC package lead frame 100 for an IC 102. In FIG. 1, lead frame 100 has not yet been cut to define the discrete pins connected to IC 102. However, a cut line 104 indicates where lead frame 100 is to be cut. The pins are labeled to be connected to various signal sources in accordance with the operation of an integrated circuit package. IC 102 has a plurality of terminals or bonding pads 106 and wired pins of lead frame 100 are connected to ones of pads 106 by bonding wires. For example, the innermost end of wired pin 54 (VSS) is connected by a bonding wire 108 to a bonding pad 110.

As shown in FIG. 1, pins 4, 7, 10, 13, 36, 42, 45, 48, and 51 are labeled as NC (non-connected or non-wired). These NC pins are susceptible to ESD failure. In FIG. 1, NC pin 51 has not been constructed in accordance with the present invention and illustrates the undesirably small pin pitch and spacing of an NC pin that can cause ESD failure. With reference to FIG. 1 and also to FIG. 2 which is an enlarged view of the portion of the lead frame including NC pin 51, the pin pitch and spacing are smallest at the innermost point, e.g., point A of NC pin 51. For example, in the illustrated lead frame, the pin pitch is about 200 μm to 300 μm at point A and the corresponding spacing between NC pin 51 and the adjacent wired pins 50 and 52, indicated by arrows 120 in FIG. 2, is 100 μm to 150 μm. In contrast, at the outermost point, e.g., point B, the pin pitch is between 1000 μm to 1500 μm and the corresponding spacing between NC pin 51 and the adjacent wired pins 50 and 52, indicated by arrows 122 in FIG. 2, is 500 μm to 750 μm.

In accordance with embodiments consistent with the present invention, the pitch and spacing between the wired pins adjacent each NC pin is increased. By shrinking NC pin 51 to extend as little as possible from the edge of lead frame 100 at point B, the inner portion of NC pin 51 is eliminated and the lead pitch spacing at point A increases dramatically. FIG. 3 shows the same enlarged view as in FIG. 2 but with NC pin 51 so shrunken. As FIG. 3 shows, NC pin 51 is limited to have a very small length at the outermost portion of the pins. Pin 51 is no longer between pins 50 and 52 at point A. As a result, the pin spacing at point A is increased from 100–150 μm between pins 50, 51 and 51, 52 to 500–750 μm between pins 50, 52, as indicated by arrow 124. This increase in pin spacing at the innermost portion of the pins decreases the electric field strength, at point A, to roughly ⅓ to ⅐ its original strength. This decrease in electric field strength allows the IC package to withstand higher ESD voltage during non-wired pin ESD stressing. Thus by increasing the local pin spacing in a lead frame, the electric field strength acting between adjacent wired pins on the lead frame is lowered. This lowering of electric field strength prevents ESD failure or, at the least, significantly reduces its probability of occurring.

Another embodiment of the present invention comprises eliminating NC pins altogether.

Figure 4:
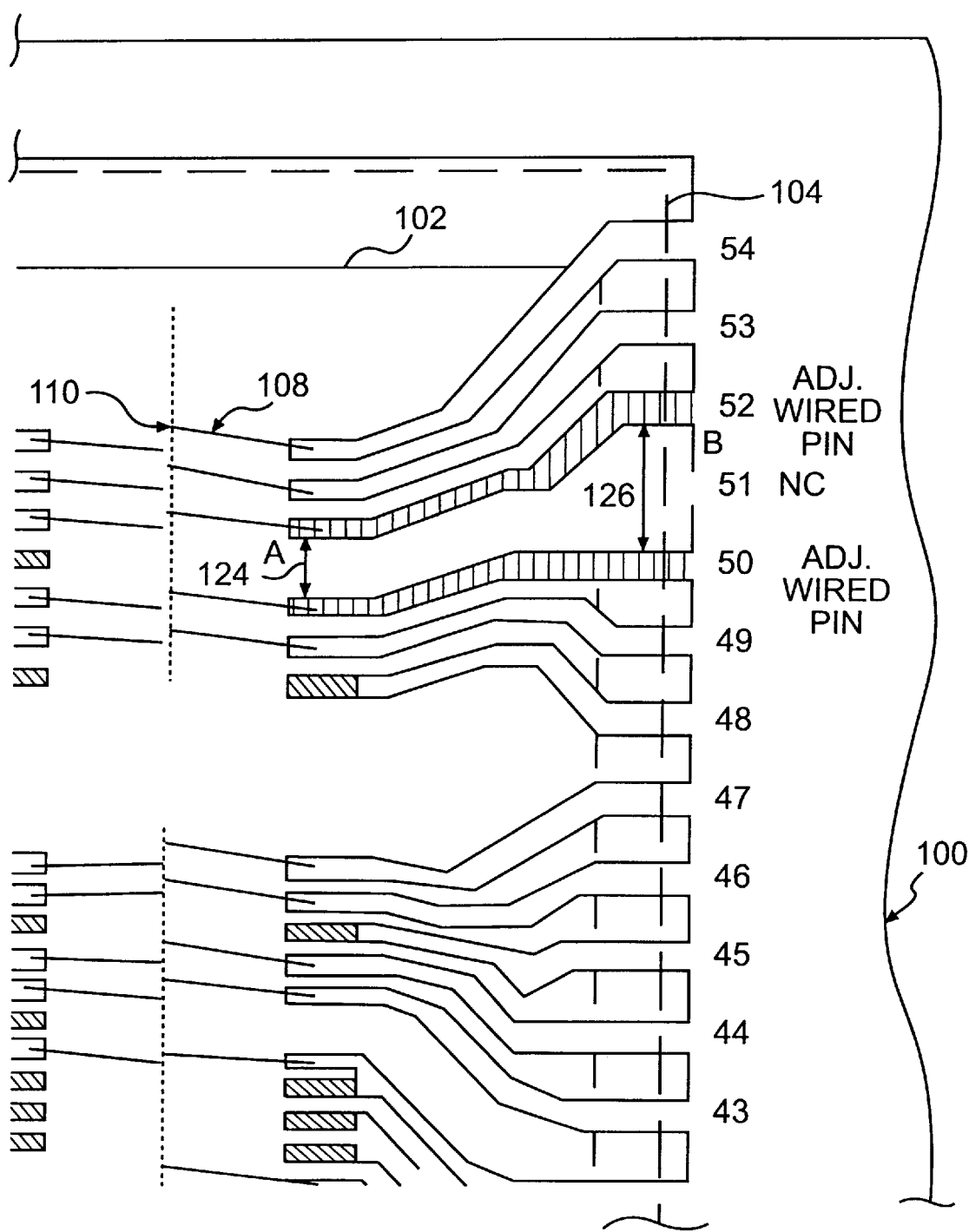
FIG. 4 depicts an enlarged view of a pin lead layout of an IC package lead frame with the non-wired pin eliminated.

In doing so, the spacing between the wired pins adjacent each NC pin is maximized. In the same manner as disclosed above, the elimination of NC pins will increase the local pin pitch and spacing at point A and decrease electric field strength. The elimination of non-wired pins will also increase local pin pitch and spacing at point B. FIG. 4 shows an enlarged view of a pin layout of an IC package lead frame with the non-wired pin eliminated. Pin 51 is no longer between pins 50 and 52 at point A. As above with respect to FIG. 3, the pin spacing at point A in FIG. 4, is increased from 100–150 μm between pins 50, 51 and 51, 52 to 500–750 μm between pins 50, 52, as indicated by arrow 134. Also at the outermost point, e.g., point B, the pin spacing is increased from 1500 μm to 2250 μm, indicated by arrows 126 in FIG. 4.

Chip carriers provide a means to direct mount an IC which improves overall size considerations. Chip carriers can be formed, for example, on a ceramic substrate which is patterned and etched to form conductive trace lines for connection to the bonding pads of the IC. Other materials such as plastic tape, printed circuit board material, and the like are also capable of being used to form chip carriers. The IC is mounted on the chip carrier to enable interface with an external circuit. More particularly, the IC is mounted on the chip carrier with the IC bonding pads connected to chip carrier wiring traces to enable coupling of the IC to I/O signals.

Figure 5:
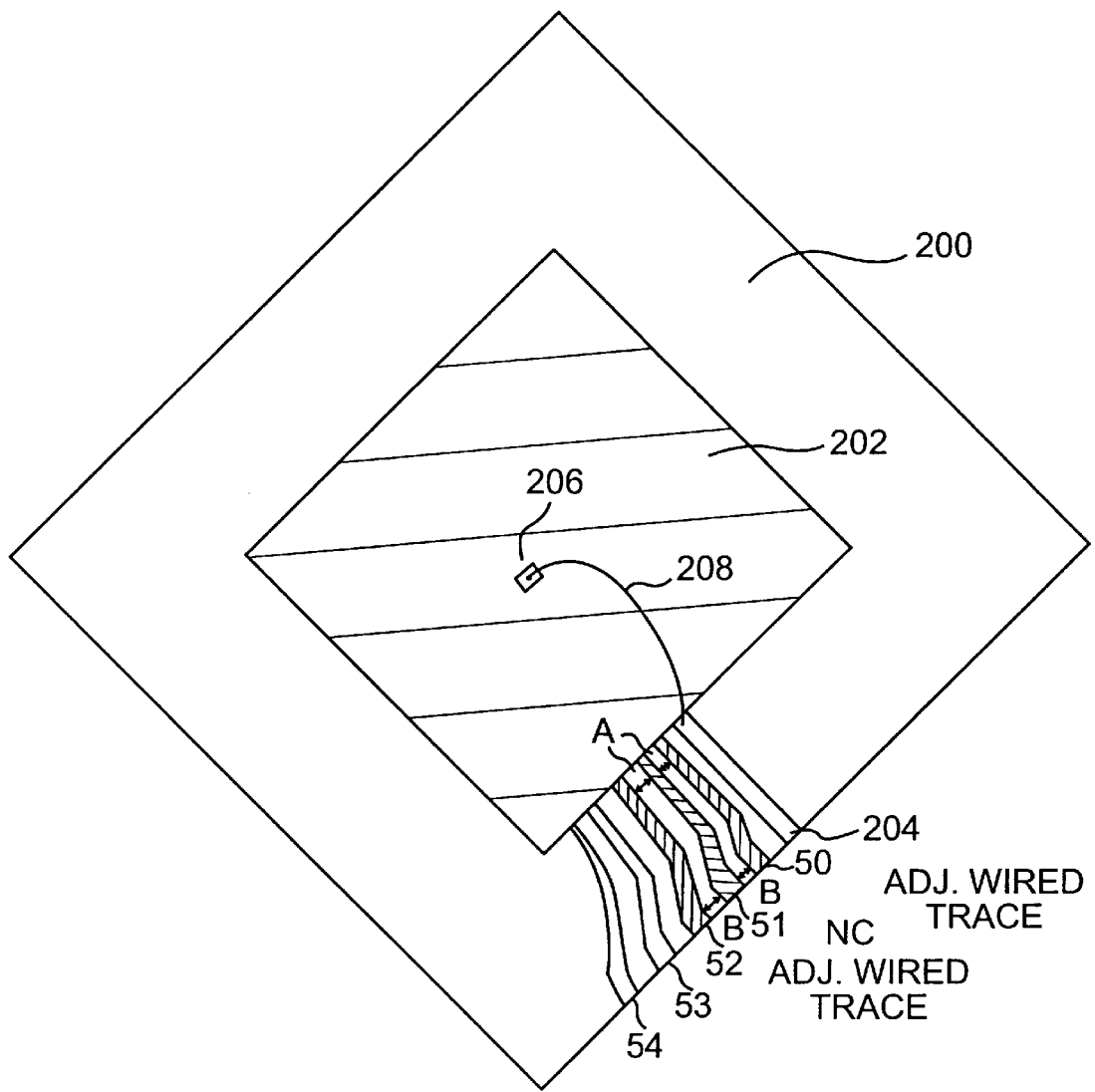
FIG. 5 depicts a wiring trace layout of a chip carrier.

FIG. 5 depicts a chip carrier 200 on which is mounted an IC 202. IC 202 is connected to chip carrier 200 through conductive wiring traces 204. An exemplary connection of a bonding pad 206 of IC 202 to one of wiring traces 204 by a bonding wire 208 is shown. Chip carrier 200 may be provided as a ceramic substrate, plastic tape, printed circuit board material or the like. As shown in FIG. 5, a wiring trace 51 is labeled as NC (non-connected or non-wired). NC trace 51 is susceptible to ESD failure. In FIG. 5, NC trace 51 has not been constructed in accordance with the present invention and illustrates the undesirably small trace pitch and spacing that can cause ESD failure. With reference to FIG. 5 the local trace spacing is narrowest at the innermost point, e.g., point A of NC trace 51. In contrast, the outermost point, e.g., point B, shows the largest local trace spacing between NC trace 51 and adjacent wired traces 50 and 52.

Figure 6:
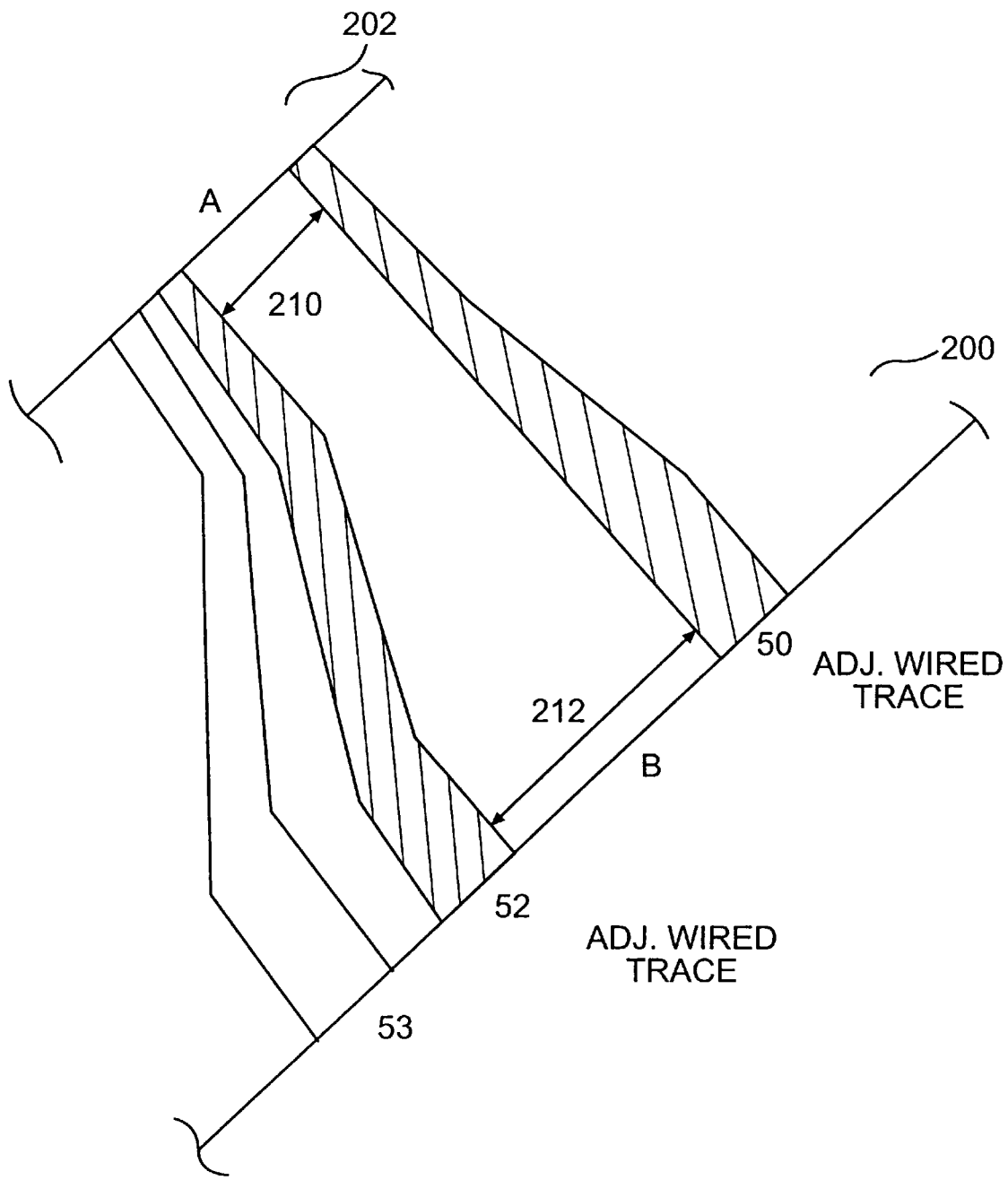
FIG. 6 depicts an enlarged view of a chip carrier with a non-wired trace eliminated.

In order to prevent ESD failure, an embodiment consistent with the present invention comprises forming a chip carrier with the non-wired trace either shrunken or eliminated. In doing so, the spacing between the wired traces adjacent each NC trace is maximized, which has the effect of decreasing electric field strength. FIG. 6 shows an enlarged view of chip carrier 200 with NC trace 51 eliminated. Trace 51 is no longer between traces 50 and 52 at point A. As in the embodiment illustrated in FIG. 3, the spacing between traces at point A in FIG. 6, is increased as indicated by arrow 210. Also at the outermost point, e.g., point B, the spacing between traces is increased as indicated by arrow 212.

While FIG. 6 shows use of a bonding wire for connection between the wiring trace of the chip carrier and the bonding pad of the chip, persons of ordinary skill will now appreciate how the invention can be applied to other chip mounting techniques. For example, in the case of flip chip mounting, the wiring traces on the chip carrier are extended to terminate on solder bumps that align with the IC's bonding pads, so that the IC can be mounted with its bonding pads in direct contact with the solder bumps. In accordance with the present invention and in the case of other mounting techniques such as flip chip mounting, NC traces can be shrunken or eliminated to prevent ESD failure.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

What is claimed is:

1. A lead frame for preventing electrostatic discharge failure in an integrated circuit package which includes a semiconductor chip, said lead frame comprising:

a plurality of wired pins; and at least one non-wired pin formed such that no more than a tip thereof at an outermost portion remains.

2. The lead frame of claim 1, wherein the at least one non-wired pin is formed such that it is eliminated entirely.

3. A chip carrier for preventing electrostatic discharge failure in an integrated circuit package which includes a semiconductor chip, said chip carrier comprising:

a plurality of wired traces; and at least one non-wired trace formed such that no more than a tip at an outermost portion remains.

4. The chip carrier of claim 3, wherein the at least one non-wired trace is not formed on the chip carrier.

5. The chip carrier of claim 3, wherein the chip carrier comprises a ceramic substrate.

6. The chip carrier of claim 3, wherein the chip carrier comprises a plastic tape.

7. The chip carrier of claim 3, wherein the chip carrier comprises a printed circuit board material.

\* \* \* \* \*